US009799812B2

(12) United States Patent
Abe

(10) Patent No.: US 9,799,812 B2
(45) Date of Patent: Oct. 24, 2017

(54) LIGHT EMITTING ELEMENT MOUNTING SUBSTRATE AND LIGHT EMITTING DEVICE

(71) Applicant: KYOCERA Corporation, Kyoto-shi, Kyoto (JP)

(72) Inventor: Yuichi Abe, Satsumasendai (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 15/309,920

(22) PCT Filed: May 11, 2015

(86) PCT No.: PCT/JP2015/063452
§ 371 (c)(1),
(2) Date: Nov. 9, 2016

(87) PCT Pub. No.: WO2015/170773
PCT Pub. Date: Nov. 12, 2015

(65) Prior Publication Data
US 2017/0148965 A1    May 25, 2017

(30) Foreign Application Priority Data

May 9, 2014  (JP) .................................. 2014-097771

(51) Int. Cl.
*H01L 33/62* (2010.01)
*H01L 33/56* (2010.01)
*H01L 33/64* (2010.01)

(52) U.S. Cl.
CPC .............. *H01L 33/62* (2013.01); *H01L 33/56* (2013.01); *H01L 33/641* (2013.01)

(58) Field of Classification Search
CPC ........ H01L 23/15; H01L 31/02002–31/02013; H01L 33/62
See application file for complete search history.

(56) References Cited

U.S. PATENT DOCUMENTS

| 2012/0106125 A1 | 5/2012 | Yokotani et al. |
| 2012/0138997 A1 | 6/2012 | Tasaki et al. |
| 2013/0242565 A1* | 9/2013 | Arai ............ H01L 33/486 362/296.04 |

(Continued)

FOREIGN PATENT DOCUMENTS

| EP | 2383808 A2 | 11/2011 |
| JP | 2009-129801 A | 6/2009 |

(Continued)

OTHER PUBLICATIONS

International Search Report (Form PCT/ISA/210) mailed on Jul. 7, 2015, issued for PCT/JP2015/063452.

(Continued)

*Primary Examiner* — Daniel Shook
(74) *Attorney, Agent, or Firm* — Procopio Cory Hargreaves and Savitch LLP

(57) ABSTRACT

A light emitting element mounting substrate, including a substrate made from a ceramic; a metal layer provided on the substrate that includes gold or silver as a primary component; and a resin layer provided covering at least a portion of the metal layer. The resin layer includes platinum, and at least one type of oxide of magnesium, calcium, and copper is present on a surface of the metal layer.

9 Claims, 2 Drawing Sheets

(56) References Cited

U.S. PATENT DOCUMENTS

2014/0008694 A1 1/2014 Yamada et al.
2014/0284088 A1* 9/2014 Nakamura ............. H05K 1/092
                                                                                                                174/257

FOREIGN PATENT DOCUMENTS

| JP | 2011-233821 A | 11/2011 |
| JP | 2012-049333 A | 3/2012 |
| JP | 2012-243846 A | 12/2012 |
| JP | 2013-065621 A | 4/2013 |
| JP | 2014-017356 A | 1/2014 |
| JP | 2014-049625 A | 3/2014 |
| WO | 2011/118109 A1 | 9/2011 |
| WO | 2012/070648 A1 | 5/2012 |
| WO | 2013/146081 A1 | 10/2013 |

OTHER PUBLICATIONS

Written Opinon (Form PCT/ISA/237) mailed on Jul. 7, 2015, issued for PCT/JP2015/063452.

* cited by examiner

LIGHT EMITTING ELEMENT MOUNTING SUBSTRATE AND LIGHT EMITTING DEVICE

TECHNICAL FIELD

The present invention relates to a light emitting element mounting substrate, and a light emitting device constituted by mounting a light emitting element on this light emitting element mounting substrate.

BACKGROUND ART

Light emitting diodes (LED) have attracted attention as light emitting elements with low power consumption. An insulating substrate is used in the mounting of such a light emitting element, and a metal layer that serves as circuitry (wiring) is provided on this substrate.

In such a configuration, the heat during light output of the LED affects the performance and the reliability of the light emitting element. As such, while resin can be used for the substrate in the case of low-output LEDs, in recent years, demand has grown for even higher levels of brightness. Accordingly, an alumina sintered compact is used as the substrate in the case of medium-output LEDs and a ceramic such as aluminum nitride or the like is used as the substrate in the case of high-output LEDs.

Additionally, there is a demand for improved light emission efficiency in light emitting devices constituted by mounting a light emitting element on the substrate with the configuration described above. As such, the metal layer provided on the substrate is covered with a resin of a whitish color (see Patent Literature 1).

CITATION LIST

Patent Literature

Patent Literature 1: Japanese Unexamined Patent Application Publication No. 2009-129801A

SUMMARY OF INVENTION

Technical Problem

In cases where the metal layer provided on the substrate is covered with a resin of a whitish color in order to improve the light emission efficiency, due to the fact that a ceramic is used as the substrate in order to increase the brightness of the LEDs, more heat is transmitted to the metal layer. This is because ceramic has a higher coefficient of thermal conductivity than resin and also has high heat radiating properties. Moreover, in cases where gold or silver, which have high heat radiating properties, is used as the metal layer, large amounts of heat will be transmitted to the metal layer. Consequently, the adhesiveness between the metal layer and the resin may decrease, and the light emission efficiency may decline due to the resin peeling from the metal layer. As such, presently, there is a demand for a light emitting element mounting substrate having a configuration including a substrate made from ceramic, a metal layer including gold or silver as a primary component provided on the substrate, and a resin layer provided covering at least a portion of the metal layer; for which the possibility of the resin layer peeling from the metal layer is low.

The present invention has been contrived to satisfy these demands and an object thereof is to provide a light emitting element mounting substrate capable of exhibiting high brightness and high light emission efficiency over an extended period of time, and a light emitting device constituted by mounting a light emitting element on this light emitting element mounting substrate.

Solution to Problem

A light emitting element mounting substrate of the present invention includes a substrate made from a ceramic; a metal layer provided on the substrate that includes gold or silver as a primary component; and a resin layer provided covering at least a portion of the metal layer. The resin layer includes platinum, and at least one type of oxide of magnesium, calcium, and copper is present on a surface of the metal layer.

Additionally, a light emitting device of the present invention is constituted by mounting a light emitting element on the light emitting element mounting substrate of the present invention having the configuration described above.

Advantageous Effects of Invention

According to the light emitting element mounting substrate of the present invention, heat radiating properties are excellent and the adhesion strength between the resin layer and the metal layer is high and, as such, high brightness and high light emission efficiency can be exhibited over an extended period of time.

Additionally, according to the light emitting device of the present invention, the light emitting device is constituted by mounting a light emitting element on the light emitting element mounting substrate of the present invention having the configuration described above and, as such, has high reliability.

DESCRIPTION OF EMBODIMENTS

Figure 1:
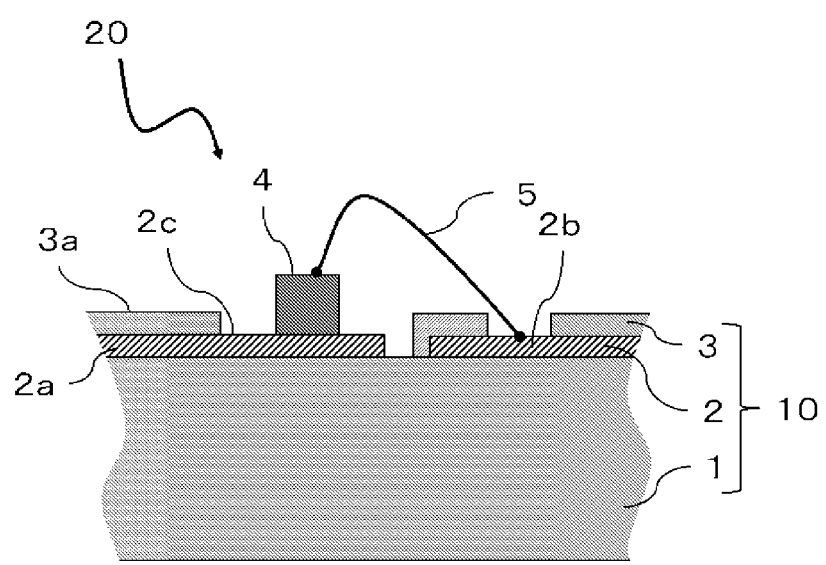
FIG. 1 is a cross-sectional view illustrating an example of a light emitting device provided with a light emitting element mounting substrate according to a present embodiment.

An example of a present embodiment is described while referring to the drawings. FIG. 1 is a cross-sectional view illustrating an example of a light emitting device provided with a light emitting element mounting substrate according to the present embodiment. Note that in the subsequent drawings, the same reference numerals are used for the same components.

As illustrated in FIG. 1, a light emitting element mounting substrate 10 of the present embodiment is provided with a substrate 1 made from ceramic; a metal layer 2 including gold or silver as a primary component provided on the substrate 1; and a resin layer 3 provided covering at least a portion of the metal layer 2. Note that the primary component in the metal layer 2 is defined as the component that accounts for greater than 50 mass % of the total 100 mass % of the components constituting the metal layer 2.

Additionally, a light emitting device 20 of the present embodiment is constituted by mounting a light emitting element 4 on the light emitting element mounting substrate 10 having the configuration described above. Note that in FIG. 1, an example is depicted in which the light emitting element 4 is electrically connected to a metal layer 2b juxtaposed with a metal layer 2a, via a bonding wire 5. Additionally, while not depicted in the drawing, in order to protect the light emitting element 4, the surface on the side of the light emitting element mounting substrate 10 where the light emitting element 4 is mounted, including the light emitting element 4, may be covered by a sealing material. Additionally, this sealing material may contain fluorescent material or the like in order to effect wavelength conversion.

The substrate 1 of the light emitting element mounting substrate 10 of the present embodiment is made from ceramic and, as such, has high insulating properties and also excellent mechanical characteristics. Additionally, the metal layer 2 includes gold or silver as the primary component and, as such, the electric resistance of the metal layer 2 is low, the coefficient of thermal conductivity is high, and the metal layer 2 has high heat radiating properties. Therefore, it is possible to mount a light emitting element 4 that exhibits high brightness and high heat generation. Moreover, it is preferable that a reflectance of the resin layer 3 be higher than that of the substrate 1 and the metal layer 2. Thus, in cases where the resin layer 3 that has a higher reflectance than the substrate 1 and the metal layer 2 is provided, the light emission efficiency of the light emitting element mounting substrate 10 improves. Particularly, in cases where the color of the substrate 1 is a dark color, it is preferable that the surface of the substrate 1 is covered with the resin layer 3.

The resin layer 3 of the light emitting element mounting substrate 10 of the present embodiment includes platinum, and at least one oxide of magnesium, calcium, and copper is present on a surface 2c of the metal layer 2. Thus, the resin layer 3 includes platinum, and at least one oxide of magnesium, calcium, and copper is present on a surface 2c of the metal layer 2. As a result, there is high adhesion strength between the metal layer 2 and the resin layer 3 in the light emitting element mounting substrate 10 of the present embodiment.

Here, the specific mechanism whereby high adhesion strength is provided is not clear, but the presence of the at least one type of oxide of magnesium, calcium, and copper has been confirmed on the surface 2c of the metal layer 2; and, as such, it is thought that the high adhesion strength is a result of the platinum included in the resin layer 3 acting as an oxidation catalyst and causing an oxidation reaction of the oxygen included in the resin layer 3 with the at least one type of magnesium, calcium, and copper included in the paste that becomes the metal layer 2.

Thus, due to the adhesion strength between the metal layer 2 and the resin layer 3 being high, the possibility of the resin layer 3 peeling from the surface 2c of the metal layer 2 becomes low. As such, the light emitting element mounting substrate 10 of the present embodiment can exhibit high brightness and high light emission efficiency over an extended period of time. Note that the magnesium, calcium, and copper included in the metal layer 2 may be present as metals or as compounds in regions other than the surface 2c of the metal layer 2. However, from the perspective of the heat radiating properties, it is preferable that the copper is present as a metal.

An aluminum oxide sintered compact, a zirconium oxide sintered compact, a compound sintered compact of aluminum oxide and zirconium oxide, a silicon nitride sintered compact, an aluminum nitride sintered compact, a silicon carbide sintered compact, or a mullite sintered compact may be used as the substrate 1 included in the light emitting element mounting substrate 10 of the present embodiment. Note that from the perspectives of workability being comparatively easy while the mechanical characteristics are excellent, it is preferable that the substrate 1 is made from an aluminum oxide sintered compact. Additionally, from the perspective of obtaining excellent heat radiating properties, it is preferable that the substrate 1 is made from an aluminum nitride sintered compact.

Additionally, a through-hole may be formed in the substrate 1. If a through-hole is formed in the substrate 1 and a through electrode made from an electrically conductive material is formed in the through-hole, connection to an external power supply is possible. Additionally, if a thermal via made from a high thermally conductive material is formed in the through-hole, the heat radiation characteristics of the substrate 1 can be improved.

The resin layer 3 included in the light emitting element mounting substrate 10 of the present embodiment includes platinum but, as described above, preferably has a reflectance that is higher than that of the substrate 1. Specifically, it is preferable that the resin layer 3 exhibits a white color. Examples of the resin layer 3 that exhibits a white color include resin layers containing a silicone resin or an epoxy resin as a primary component and, in addition thereto, a white inorganic filler such as titanium oxide, aluminum oxide, zirconium oxide, barium oxide, barium sulfate, or the like.

A first example of the metal layer 2 has a configuration in which the primary component is silver, copper is included at a content of not less than 20 mass % and not greater than 40 mass %, and at least one of titanium, zirconium, hafnium, and niobium is included.

When this configuration is satisfied, the content of the copper is not less than 20 mass % and not greater than 40 mass % and, as a result, the metal layer 2 and the resin layer 3 will have high adhesion strength and excellent heat radiating properties. Here, it is thought that the high adhesion strength is provided due to the copper being included at the content of not less than 20 mass % and not greater than 40 mass %, which leads to the widening of the region on the surface of the metal layer 2 where the oxidation catalytic action, by the platinum included in the resin layer 3, is obtained. Additionally, it is thought that the components constituting the substrate 1 react and form a compound when subjected to thermal treatment due to the at least one of titanium, zirconium, hafnium, and niobium being included, which results in the substrate 1 and the metal layer 2 being strongly bonded to each other.

It is preferable that a total content of the titanium, zirconium, hafnium, and niobium is not less than 1 mass % and not greater than 8 mass %. Note that "content" refers to the proportion of the total 100 mass % of the components constituting the metal layer 2.

Additionally, a second example of the metal layer 2 has a configuration in which the primary component is silver, copper is included at a content of not less than 20 mass % and not greater than 40 mass %, at least one of titanium, zirconium, hafnium, and niobium is included, and at least one of molybdenum, osmium, rhenium, and tungsten is included. When this configuration is satisfied, due to the fact that the molybdenum, osmium, rhenium, and tungsten are metals with high melting points, protrusion from a predetermined position when forming of the metal layer 2 will be small. Additionally, due to the fact that shape retention is high from when printing the metal layer paste, fine wiring is possible. Note that it is preferable that a total content of the molybdenum, osmium, rhenium, and tungsten is not less than 3 mass % and not greater than 20 mass %.

Furthermore, a third example of the metal layer 2 has a configuration in which the primary component is silver, copper is included at a content of not less than 20 mass % and not greater than 40 mass %, at least one of titanium, zirconium, hafnium, and niobium is included, and at least one of indium, zinc, and tin is included.

Furthermore, a fourth example of the metal layer 2 has a configuration in which the primary component is silver, copper is included at a content of not less than 20 mass % and not greater than 40 mass %, at least one of titanium, zirconium, hafnium, and niobium is included, at least one of molybdenum, osmium, rhenium, and tungsten is included, and at least one of indium, zinc, and tin is included.

Thus, when at least one of indium, zinc, and tin is included in the metal layer 2, the voids in the metal layer 2 can be reduced as a result of melting during thermal treatment. Note that it is preferable that a total content of the indium, zinc, and tin is not less than 0.5 mass % and not greater than 5 mass %.

Additionally, a fifth example of the metal layer 2 has a configuration in which the primary component is gold or silver, a content of a glass component is not less than 0.5 mass % and not greater than 5 mass %, and a total content, in terms of oxides, of magnesium, calcium, and copper is not less than 0.1 mass % and not greater than 5.0 mass %.

As in the fifth example given above, when the total content in terms of oxides of the magnesium, calcium, and copper in the metal layer 2 is not less than 0.1 mass % and not greater than 5.0 mass %, the content of the primary component will be high and, as such, the metal layer 2 will have high heat radiating properties and adhesion strength between the metal layer 2 and the resin layer 3 that is sufficient for practical use will be obtained.

Additionally, it is preferable that a content of the platinum in the resin layer 3 is not less than 0.05 mass % and not greater than 0.15 mass %. When the content of the platinum is within this range, increases in costs can be suppressed and high adhesion strength between the metal layer 2 and the resin layer 3 can be obtained.

Note that an example of a method for confirming the components included in the metal layer 2 and the resin layer 3 includes cutting the light emitting element mounting substrate 10; observing, as the observation surface, a cross-section that has been polished using a cross-section polisher (CP) under a scanning electron microscope (SEM) at a magnification of not less than 1000-times and not greater than 10000-times; and using an attached energy dispersive X-ray analyzer (EDS). The components of the metal layer 2 and the resin layer 3 can also be confirmed by shaving each of the metal layer 2 and the resin layer 3, and using an ICP emission spectrophotometer (ICP) or a fluorescent X-ray analysis device (XRF).

Additionally, to confirm whether or not an oxide of magnesium, calcium, and/or copper is present on the surface 2c of the metal layer 2, the surface of the metal layer 2 is exposed by removing the resin layer 3 on the metal layer 2 by applying a strong alkaline solution such as an aqueous solution of sodium hydroxide and causing swelling, or by shaving the resin layer 3. Then, confirmation is performed using mapping by an EDS attached to the SEM or an electron probe microanalyser (EPMA). For example, in the case of confirming the presence of magnesium oxide, the mapping of magnesium and oxygen is examined for the presence of sites where the existing locations of magnesium and oxygen overlap.

Additionally, the contents of the components of the metal layer 2 and the resin layer 3 can be confirmed by shaving each of the metal layer 2 and the resin layer 3 and measuring using an ICP or an XRF. Note that in the case of a configuration such as the fifth example of the metal layer 2, after measuring and finding the contents of the element constituting the glass component with the exception of oxygen, and the magnesium, calcium, and copper using an ICP or an XRF, each of the contents may be found in terms of oxides. Specifically, when the element included in the glass component with the exception of oxygen is silicon, the content may be found in terms of $SiO_2$, magnesium may be found in terms of MgO, calcium may be found in terms of CaO, and copper may be found in terms of CuO.

Additionally, it is preferable that the resin layer 3 includes, on a surface 3a, a plurality of projecting portions 3b with a height of not less than 1.5 μm, and that the projecting portions 3b are arranged with regularity. When this configuration is satisfied, reflectance will increase and the surface area of the projecting portions 3b will increase and, as a result, the heat trapped in the resin layer 3 can be efficiently dissipated. Note that in consideration of the provision of a sealing member for protecting the light emitting element 4 and failures occurring as a result of the projecting portions 3b falling off due to contact or the like, it is preferable that the height of the projecting portions 3b is not greater than 5.0 μm.

Figure 2A:
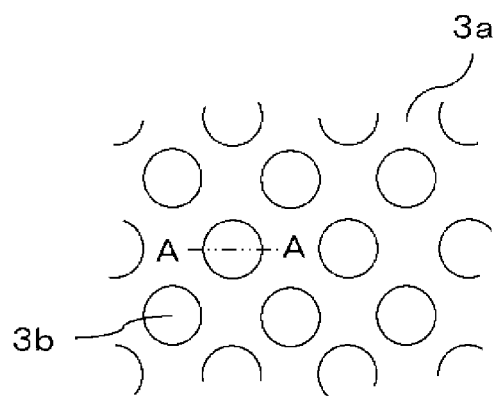
FIG. 2A is a plan view illustrating an example of a surface of the resin layer of the light emitting element mounting substrate according to a present embodiment.
Figure 2B:
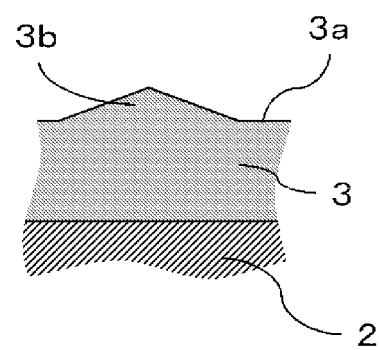
FIG. 2B is a cross-sectional view taken along line A-A in FIG. 2A.

The projecting portions 3b on the surface 3a of the resin layer 3 are described using FIGS. 2A and 2B. FIG. 2A is a plan view illustrating an example of the surface 3a of the resin layer 3. FIG. 2B is a cross-sectional view taken along line A-A in FIG. 2A. The projecting portions 3b may be conical, triangular-pyramidal or quadrangular-pyramidal. FIGS. 2A and 2B illustrate conical projecting portions 3b. Moreover, the projecting portions 3b being arranged with regularity means that, as illustrated in FIG. 2A, the projecting portions 3b exist in a constant spacing on the surface 3a of the resin layer 3, and errors in distances between the vertices of any two neighboring projecting portions 3b are within ±10 μm. In the present embodiment, this manner of configuration is referred to as an "arrangement with regularity".

Moreover, whether or not the projecting portions 3b on the surface 3a of the resin layer 3 are arranged with regularity is confirmed by, first, visually confirming the surface 3a for the presence of a plurality of the projecting portions 3b; then, cutting the light emitting element mounting substrate 10 along a straight line connecting the vertices among the plurality of projecting portions 3b; polishing the cross-section using a CP and observing this polished cross-section as an observation surface under an optical microscope or a SEM at a magnification of not less than 1000-times and not greater than 10000-times; and measuring the distance between the vertices. This method of confirmation also includes cutting the light emitting element mounting substrate 10 along a straight line that connects the vertices and that intersects the previously mentioned straight line at about an right angle; polishing the cross-section using a CP and observing this polished cross-section as an observation surface under an optical microscope or a SEM at a magnification of not less than 1000-times and not greater than 10000-times; and measuring the distance between the vertices. Then, if the error between the measured values is within ±10 μm, the projecting portions 3b on the surface 3a of the resin layer 3 are determined to be arranged with regularity.

Additionally, the height of the projecting portions 3b in the observation surface described above can be found using a line connecting non-bulging portions on the left and right of the projecting portions 3b as a reference line, and taking the average of the heights of 10 of the projecting portions 3b measured in such a manner. Additionally, provided that measuring is performed in a manner where the vertices are connected, the spacing between the projecting portions 3b can be confirmed using a conventional contact- or non-contact-type roughness measuring device or shape measuring device.

Additionally, it is preferable that an arithmetic mean roughness Ra of the surface 2c of the metal layer 2 is not less than 0.3 μm and not greater than 0.8 μm. When this configuration is satisfied, high adhesion strength between the metal layer 2 and the resin layer 3 will be obtained. Note that in the light emitting element mounting substrate 10, the surface 2c of the metal layer 2 is the unexposed surface that is covered by the resin layer 3.

Moreover, to confirm the arithmetic mean roughness Ra of the surface 2c of the metal layer 2, the surface 2c of the metal layer 2 is exposed by removing the resin layer 3 on the metal layer 2 by applying a strong alkaline solution such as, for example, an aqueous solution of sodium hydroxide and causing swelling, or by shaving the resin layer 3. Thereafter, using a contact- or non-contact-type roughness measuring device, the arithmetic mean roughness Ra is measured in accordance with JIS B 0601-2001, at five discretionary locations. The average of the obtained measured values is taken as the value of the arithmetic mean roughness Ra of the surface 2c of the metal layer 2 in the present embodiment.

Hereinafter, an example of a manufacturing method for the light emitting element mounting substrate 10 according to the present embodiment is described. First, as the substrate 1, for example, an aluminum nitride sintered compact or an aluminum oxide sintered compact is prepared using known molding and sintering methods. Note that in the forming of the aluminum oxide sintered compact, barium oxide (BaO) and zirconium oxide ($ZrO_2$) may be included to increase the reflectance of the substrate 1.

Then, in cases where forming a through-hole in the substrate 1, the outer shape and the hole may be formed together when forming the powder compact, the hole may be formed by punching, blasting, or lasering the powder compact for which only the outer shape has been formed, or the hole may be formed by blasting or lasering the sintered compact. Note that a thickness of the substrate 1 is, for example, not less than 0.15 mm and not greater than 1.5 mm.

Next, a manufacturing method for the metal layer 2 is described for the first, second, fourth, and fifth examples of the metal layer 2 described above. Regarding a metal layer paste that becomes the metal layer 2 in the first, second, and fourth examples, an aluminum nitride sintered compact is used as the substrate 1; and regarding a metal layer paste that becomes the metal layer 2 in the fifth example, an aluminum oxide sintered compact is used as the substrate 1.

First, in the first example of the metal layer 2, silver powder with an average particle diameter of not less than 1.0 μm and not greater than 5.0 μm, copper powder with an average particle diameter of not less than 1.0 μm and not greater than 5.0 μm, titanium powder with an average particle diameter of not less than 0.5 μm and not greater than 5.0 μm, and an organic vehicle are prepared and mixed at desired weighed amounts. Thus, a (first) metal layer paste is fabricated. A mass ratio of the silver powder, the copper powder, and the titanium powder (silver:copper:titanium) is, for example, 63:34:3.

The organic vehicle is constituted by dissolving an organic binder in an organic solvent and, for example, a mass ratio of the organic solvent to the organic binder is from 2 to 6 (organic solvent) to 1 (organic binder). Examples of the organic binder include one type or a mixture of two or more types selected from acrylics such as polybutyl methacrylate, polymethyl methacrylate, and the like; celluloses such as nitrocellulose, ethyl cellulose, cellulose acetate, butyl cellulose, and the like; polyethers such as polyoxymethylene and the like; and polyvinyls such as polybutadiene, polyisoprene, and the like.

Examples of the organic solvent include one type or a mixture of two or more types selected from carbitol, carbitol acetate, terpineol, metacresol, dimethyl imidazole, dimethyl imidazolidinone, dimethyl formamide, diacetone alcohol, triethylene glycol, paraxylene, ethyl lactate, and isophorone.

In the second example of the metal layer 2, silver powder with an average particle diameter of not less than 1.0 μm and not greater than 5.0 μm, copper powder with an average particle diameter of not less than 1.0 μm and not greater than 5.0 μm, titanium powder with an average particle diameter of not less than 0.5 μm and not greater than 5.0 μm, molybdenum powder with an average particle diameter of not less than 1.0 μm and not greater than 5.0 μm, and an organic vehicle are prepared and mixed at desired weighed amounts. Thus, a (second) metal layer paste is fabricated. A mass ratio of the silver powder, the copper powder, the titanium powder, and the molybdenum powder (silver:copper:titanium:molybdenum) is, for example, 56:27:2:15.

In the fourth example of the metal layer 2, silver powder with an average particle diameter of not less than 1.0 μm and not greater than 5.0 μm, copper powder with an average particle diameter of not less than 1.0 μm and not greater than 5.0 μm, titanium powder with an average particle diameter of not less than 0.5 μm and not greater than 5.0 μm, molybdenum powder with an average particle diameter of not less than 1.0 μm and not greater than 5.0 μm, tin powder with an average particle diameter of not less than 2.0 μm and not greater than 10.0 μm, and an organic vehicle are prepared and mixed at desired weighed amounts. Thus, a (fourth) metal layer paste is fabricated. A mass ratio of the silver powder, the copper powder, the titanium powder, the molybdenum powder, and the tin powder (silver:copper:titanium:molybdenum:tin) is, for example, 55:25:3:15:2.

In the fifth example of the metal layer 2, silver powder with an average particle diameter of not less than 0.5 μm and not greater than 3.5 μm, glass powder, at least one of magnesium powder, calcium powder, and copper powder with an average particle diameter of not less than 0.3 μm and not greater than 1.5 μm (hereinafter referred to as "inorganic powder"), and an organic vehicle are prepared.

It is preferable that glass powder with a softening point of not lower than 500° C. and not higher than 700° C. is used, and it is more preferable that a glass powder with a softening point of not lower than 600° C. and not higher than 700° C. is used. Additionally, it is preferable that an average particle diameter of the glass powder is not less than 8% and not greater than 60% of the average particle diameter of the gold powder or the silver powder. When the softening point is not lower than 600° C. and not higher than 700° C., and when the average particle diameter is not less than 8% and not greater than 60% of the average particle diameter of the metal powder, the glass powder included in the metal layer paste will soften easier when sintering and move easily to the substrate 1 side. As a result, bonding strength between the substrate 1 and the metal layer 2 can be improved.

Examples of such types of glass powder include $R_2O$—$B_2O_3$—$SiO_2$ based powders (R: alkali metal element), $SiO_2$—$Bi_2O_3$—$B_2O_3$ based powders, $R_2O$—$SiO_2$—$B_2O_3$—$Bi_2O_3$ based powders, $SiO_2$—$ZnO$—$B_2O_3$ based powders, $R_2O$—$SiO_2$—$B_2O_3$—$ZnO$ based powders, and the like.

Then, the silver powder, the glass powder, the inorganic powder, and the organic vehicle are mixed at desired weighed amounts. Thus, a (fifth) metal layer paste is fabricated. Compounding amounts in 100 mass % of a silver paste here may be in ranges of, for example, not less than 77.0 mass % and not greater than 87.0 mass % of the silver powder, not less than 0.5 mass % and not greater than 5 mass % of the glass powder, not less than 0.1 mass % and not greater than 5.0 mass % of the inorganic powder, and not less than 10 mass % and not greater than 20 mass % of the organic vehicle.

As subsequent processes when using the first, second, or fourth metal layer paste, first, the substrate 1 is subjected to thermal treatment in an air atmosphere at a temperature of not lower than 800° C. and not higher than 900° C. Then, one of the metal layer pastes is printed using a known screen printing method or the like, and dried. Thereafter, the metal layer paste is held in a vacuum atmosphere at a maximum temperature of not lower than 790° C. and not higher than 860° C. for no shorter than three minutes and no longer than 15 minutes. Thus, the metal layer 2 is formed.

Next, the paste that becomes the resin layer 3 (hereinafter referred to as the "resin layer paste") is prepared. The resin layer paste is constituted by, for example, dispersing a silicone resin raw material including platinum and a white inorganic filler powder in an organic solvent.

Examples of the primary component of the silicone resin raw material including platinum include organopolysiloxane, organohydrogenpolysiloxane, platinum-containing polysiloxane, and the like. Examples of the white inorganic filler include titanium oxide, aluminum oxide, zirconium oxide, barium oxide, barium sulfate, and the like. It is preferable that a content of the platinum in the resin layer 3 be adjusted to be not less than 0.05 mass % and not greater than 0.15 mass %.

Additionally, in the fabrication of the resin layer paste, it is preferable that a content of low-molecular-weight siloxane in the resin layer 3 is adjusted to be not greater than 200 ppm. This is in order to reduce the low-molecular-weight siloxane present in the region of the surface 2c of the metal layer 2 where the bonding wire 5 adheres because low-molecular-weight siloxane has properties that tend to repel molten metals. With the adjustments described above, the adhesion processing of the bonding wire 5 on the surface 2c of the metal layer 2 can be performed easily.

Note that the resin layer paste is formulated so that a mass ratio is 0.5 to 4 of the white inorganic filler and 20 to 100 of the organic solvent to 1 of the silicone resin raw material including platinum. Additionally, cross-linking agents, diluents, reaction inhibitors, and the like may be added as desired.

Then, the obtained resin layer paste is printed so as to cover desired regions of the substrate 1 and the metal layer 2. Here, the projecting portions 3b may be formed on the surface 3a of the resin layer 3 by preparing a die capable of forming the shape of the projecting portions 3b and, following the printing of the resin paste, applying and then removing this die.

Next, the printed resin paste is subjected to thermal treatment by holding the resin paste at a maximum temperature of not lower than 140° C. and not higher than 200° C. for no shorter than 0.5 hours and no longer than 3 hours. Note that a thickness of the resin layer 3 is, for example, not less than 10 μm and not greater than 70 μm. The light emitting element mounting substrate 10 of the present embodiment can be obtained by going through the processes described above.

Next, as subsequent processes when using the fifth metal layer paste, first, the fifth metal layer paste is printed using a known screen printing method or the like, and dried at not lower than 80° C. and not higher than 150° C. Then, for example, the metal layer paste is held in an air atmosphere at a maximum temperature of not lower than 820° C. and not higher than 900° C. for no shorter than five minutes and no longer than 3 hours. Thus, the metal layer 2 is formed. Subsequent forming of the resin layer 3 may be performed via the same method described above.

Next, a second manufacturing method for the metal layer 2 including gold as the primary component is described. A gold resinate paste including: a gold resinate including a gold-containing organic compound and an inorganic powder in an organic solvent may be used as the metal layer 2 including gold as the primary component.

The prepared gold resinate paste is printed on the substrate 1 using a known screen printing method or the like and, then, is dried at not lower than 80° C. and not higher than 150° C. Then, for example, the gold resinate paste is held in an air atmosphere at a maximum temperature of not lower than 400° C. and not higher than 900° C. for no shorter than five minutes and no longer than 3 hours. Thus, the metal layer 2 is formed. Subsequent forming of the resin layer 3 may be performed via the same method described above.

The thickness of the metal layer 2 may be adjusted to a desired thickness by repeating the printing, drying, and thermal treatment, or by performing the thermal treatment after completing multiple repetitions of the printing and drying processes.

Thus, for example, the thickness of the metal layer 2 is not less than 5 μm and not greater than 70 μm when the metal layer 2 includes silver as the primary component, and is not less than 0.5 μm and not greater than 10 μm when the metal layer 2 includes gold as the primary component.

A portion of the surface of the metal layer 2 may be subjected to plating treatment. As a result of applying this plating treatment, the adhesion processing of the light emitting element 4, the bonding wire 5, and the like becomes easier, and corrosion of the metal layer 2 due to oxidation can be suppressed. Any known type of plating may be used and examples thereof include gold plating, silver plating, nickel-gold plating, and the like.

Thus, with the light emitting element mounting substrate 10 of the present embodiment obtained through the manufacturing method described above, the resin layer 3 includes platinum, the metal layer 2 includes gold or silver as the primary component, and at least one type of oxide of magnesium, calcium, and copper is present on the surface 2c of the metal layer 2. As a result, the electric resistance of the metal layer 2 is low and the thermal conductivity is high, which results in high heat dissipation characteristics. Additionally, the adhesion strength between the metal layer 2 and the resin layer 3 is high and, as such, the light emitting element mounting substrate 10 of the present embodiment can exhibit high brightness and high light emission efficiency over an extended period of time.

Furthermore, in the fabrication of the light emitting element mounting substrate 10 of the present embodiment, if the substrate 1 in which a split groove is formed is used, the metal layer 2 and the resin layer 3 are formed according to the methods described above and, then, the resulting product is split along the split groove, a plurality of the light emitting element mounting substrate 10 can be efficiently fabricated. Note that the manufacturing method for the light emitting element mounting substrate 10 of the present embodiment is not limited to the manufacturing method described above.

Next, the light emitting device 20 of the present embodiment illustrated in FIG. 1 can, for example, be obtained by mounting the light emitting element 4 on the metal layer 2 of the light emitting element mounting substrate 10 of the present embodiment, and connecting the light emitting element 4 to the metal layer 2 by the bonding wire 5. The light emitting device 20 of the present embodiment fabricated in this manner has high reliability.

Hereinafter, specific descriptions of working examples of the present invention are given, but the present invention is not limited to these working examples.

Working Example 1

Samples with different contents, in terms of oxides, of magnesium, calcium, and copper in the metal layer were fabricated and subjected to reliability testing. First, using silicon oxide and magnesium oxide as sintering aids, a substrate made from an aluminum oxide sintered compact including aluminum oxide at a content of 96 mass %, with a thickness of 0.32 mm was prepared.

Next, as the metal layer paste that becomes the metal layer, silver powder having an average particle diameter of 2.0 μm, $R_2O$—$B_2O_3$—$SiO_2$ based glass powder having an average particle diameter of 1.3 μm and a softening point of 630° C., inorganic powder (magnesium powder, calcium powder, copper powder), and an organic vehicle were prepared.

Compounded amounts were as follows: 2.5 mass % of the glass powder and 15 mass % of the organic vehicle were used; the inorganic powder was weighed so that the content thereof, in terms of oxides, in 100 mass % of the components constituting the metal layer, was the amount shown in Table 1; and the silver powder was used for the remainder. These components were mixed and, thus, the metal layer paste was obtained.

Then, each of the metal layer pastes was printed on each of the substrates using a screen printing method. Thereafter, the products were dried at 100° C., and subjected to thermal treatment by holding in an air atmosphere at a maximum temperature of 900° C. for 15 minutes. Note that the thickness of the metal layers after the thermal treatment was 10 μm.

Next, platinum-containing polysiloxane and a white inorganic filler made from titanium oxide were dispersed in an organic solvent to prepare the resin layer paste. Note that the platinum was included in the resin layer paste in an amount equivalent to a content of 0.1 mass % in the total 100 mass % of the components constituting the resin layer.

Then, the obtained resin layer paste was printed at desired locations so as to cover at least a portion of the surface of the metal layer. Then, thermal treatment was performed in which the product was held at a maximum temperature of 150° C. for one hour. Note that the thickness of the resin layer was 20 μm. Sample Nos. 1 to 21 were obtained in this manner. Note that 20 pieces of each sample were prepared.

Next, the reliability testing is described. The samples were placed in an accelerated life test device set to a temperature of 85° C. and a humidity of 85%. The samples were removed one at a time every 50 hours. A peel test was performed by attaching polyester film to the surface of the resin layer and then pulling upward on the film. The time when peeling of the resin layer from the metal layer was confirmed was recorded in Table 1.

TABLE 1

| Sample No. | MgO content (mass %) | CaO content (mass %) | CuO content (mass %) | Total content (mass %) | Time |
|---|---|---|---|---|---|
| 1  | 0    | 0    | 0    | 0    | 100  |
| 2  | 0.05 | 0    | 0    | 0.05 | 550  |
| 3  | 0.1  | 0    | 0    | 0.1  | 750  |
| 4  | 2.5  | 0    | 0    | 2.5  | >1000 |
| 5  | 5.0  | 0    | 0    | 5.0  | 950  |
| 6  | 6.0  | 0    | 0    | 6.0  | 650  |
| 7  | 0    | 0.05 | 0    | 0.05 | 450  |
| 8  | 0    | 0.1  | 0    | 0.1  | 650  |
| 9  | 0    | 2.5  | 0    | 2.5  | >1000 |
| 10 | 0    | 5.0  | 0    | 5.0  | 850  |
| 11 | 0    | 6.0  | 0    | 6.0  | 550  |
| 12 | 0    | 0    | 0.05 | 0.05 | 600  |
| 13 | 0    | 0    | 0.1  | 0.1  | 800  |
| 14 | 0    | 0    | 2.5  | 2.5  | >1000 |
| 15 | 0    | 0    | 5.0  | 5.0  | 1000 |
| 16 | 0    | 0    | 6.0  | 6.0  | 700  |
| 17 | 0.01 | 0.02 | 0.02 | 0.05 | 500  |
| 18 | 0.03 | 0.03 | 0.04 | 0.1  | 700  |
| 19 | 0.8  | 0.8  | 0.9  | 2.5  | >1000 |
| 20 | 1.6  | 1.7  | 1.7  | 5.0  | 900  |
| 21 | 2.0  | 2.0  | 2.0  | 6.0  | 600  |

As shown in Table 1, it is clear that endurance time is longer due to the metal layer including at least one type of oxide of magnesium, calcium, and copper. Additionally, it is clear that endurance time is even longer due to the total content of magnesium, calcium, and copper in the metal layer being, in terms of oxides, not less than 0.1 mass % and not greater than 5.0 mass %. Note that for Sample Nos. 4, 9, 14, and 19, even after 1000 hours, peeling of the resin layer from the metal layer was not confirmed.

Note that when confirming the mapping of the surface of the metal layer for Mg, Ca, Cu, and O using EPMA, sites where one of Mg, Ca, and Cu overlapped with O were confirmed for Sample Nos. 2 to 21.

Considering the results shown above and given that the heat radiating properties are high due to the primary component of the metal layer being gold or silver, the light emitting element mounting substrate of the present embodiment has excellent heat radiating properties and the adhesion strength between the resin layer and the metal layer is high. Therefore, it is clear that high brightness and high light emission efficiency can be exhibited over an extended period of time.

Working Example 2

Next, samples having different metal layer configurations were fabricated and the bonding strength of the metal layer, shape retention of the metal layer, and void volume in the metal layer were confirmed.

First, silver powder with an average particle diameter of 2.5 μm, copper powder with an average particle diameter of 2.5 μm, titanium powder with an average particle diameter of 1.0 μm, molybdenum powder with an average particle diameter of 2.0 μm, tin powder with an average particle diameter of 5.0 μm, and an organic vehicle were prepared and mixed at contents shown in Table 2. Thus, metal layer pastes were fabricated.

An aluminum nitride sintered compact was used as the substrate, and the substrate was subjected to thermal treatment in an air atmosphere at a temperature of 850° C. Then, each of the metal layer pastes were printed on each of the substrates using a screen printing method, and dried. Thereafter, the metal layer pastes were held in a vacuum atmosphere at a maximum temperature of 820° C. for five minutes. Thus, the metal layers were formed. Note that the thickness of the metal layers after the thermal treatment was 15 μm.

Then, the bonding strength was evaluated by measuring the peel strength of the metal layer in accordance with HS C 6481-1996. When measuring, first, the metal layer was etched to a size of 2×2 mm$^2$ and then, using flux and solder, a plated lead (Sn plated copper wire) with a thickness of 0.6 mm was bonded (soldered) to the surface of the metal layer. Note that with respect to the bonding strength, in Table 2, Sample No. 23 was a benchmark. Samples for which the value of the peel strength was less than that of Sample No. 23 were indicated with a "B" and samples for which the value of the peel strength was greater than or equal to that of Sample No. 23 were indicated with an "A".

Additionally, as the metal layers were formed using the same screen, shape retention was also evaluated with Sample No. 27 as a benchmark. The evaluation method was as follows. Samples for which the metal layer shape when viewed from above was larger than that of Sample No. 27 were indicated with a "B", and samples for which the metal layer shape when viewed from above was equal to that of Sample No. 27 were indicated with an "A".

Additionally, the void volume was found by measuring an area $S_v$ of the void between the substrate and the metal layer when viewed from above using an ultrasonic flaw detection method, and calculating the area proportion of $S_v$ in the observed area $S_o$ ($S_v/S_o \times 100$). The measurement conditions of the ultrasonic flaw detection method were as follows: flaw detection frequency=50 MHz, gain=30 dB, scanning pitch=100 μm. Sample No. 25 was a benchmark and samples for which the value of the void volume was greater than that of Sample No. 25 were indicated with a "B", and samples for which the value of the void volume was less than or equal to that of Sample No. 25 were indicated with an "A".

Additionally, the metal layers were sampled by shaving, and the contents thereof were found using an ICP. Furthermore, the samples were cut and cross-sections polished using a CP were used as measuring surfaces. In Sample Nos. 23 to 33, confirmation of the EPMA mapping of these measuring surfaces showed the presence of sites on the surface side of the substrates where titanium and nitrogen (components constituting the substrate, namely the aluminum nitride substrate) overlapped. The results are shown in Table 2.

TABLE 2

| Sample No. | Silver (mass %) | Copper (mass %) | Titanium (mass %) | Molybdenum (mass %) | Silver (mass %) | Bonding strength | Shape retention | Void volume |
|---|---|---|---|---|---|---|---|---|
| 22 | 65.0 | 35.0 | — | — | — | B | B | B |
| 23 | 64.0 | 35.0 | 1.0 | — | — | A | B | B |
| 24 | 63.0 | 34.0 | 3.0 | — | — | A | B | B |
| 25 | 63.0 | 33.5 | 3.0 | — | 0.5 | A | B | A |
| 26 | 61.0 | 31.0 | 8.0 | — | — | A | B | B |
| 27 | 62.0 | 33.0 | 2.0 | 3.0 | — | A | A | B |
| 28 | 56.0 | 27.0 | 2.0 | 15.0 | — | A | A | B |
| 29 | 54.0 | 24.0 | 2.0 | 20.0 | — | A | A | B |
| 30 | 62.0 | 33.0 | 3.0 | — | 2.0 | A | B | A |
| 31 | 55.5 | 26.0 | 3.0 | 15.0 | 0.5 | A | A | A |
| 32 | 55.0 | 25.0 | 3.0 | 15.0 | 2.0 | A | A | A |
| 33 | 53.0 | 24.0 | 3.0 | 15.0 | 5.0 | A | A | A |

As shown in Table 2, it is clear that the bonding strength with the substrate improves due to titanium being included in the metal layer. Additionally, it is clear that the shape retention of the metal layer improves due to molybdenum being included in the metal layer. Furthermore, it is clear that voids can be reduced due to tin being included in the metal layer. Moreover, when the content of the copper is not less than 20 mass % and not greater than 40 mass %, the adhesion strength between the metal layer and the resin layer is high. From this, it is clear that a light emitting element mounting substrate with even greater reliability can be obtained if the adhesion strength with the substrate is high, the shape retention is high, and the voids are few.

Additionally, the bonding strength with the substrate also increased in cases where zirconium powder, hafnium powder, and niobium powder were used in place of the titanium powder. Furthermore, the metal layer also had high shape retention in cases where osmium powder, rhenium powder, and tungsten powder were used in place of the molybdenum powder. Additionally, voids were also few in cases where indium powder and zinc powder were used in place of the tin powder.

Working Example 3

Next, samples including resin layers with different surface characteristics were fabricated and the reflectances thereof were measured. Note that, with the exception of the surface characteristics of the resin layer, the samples were fabricated via the same method as Sample No. 4 in Working Example 1.

Note that for Sample No. 35, after forming the resin layer, the surface thereof was subjected to blasting processing to form the projecting portions. Additionally, for Sample Nos. 36 to 39, after printing the resin layer paste, the projecting portions were formed by pressing using a die such that the projecting portions were cylindrical and arranged regularly as illustrated in FIGS. 2A and 2B.

Then, the Sample Nos. 35 to 39 were cut along a straight line connecting the vertices of the projecting portions and the cross-section was polished using a CP. The polished cross-section was used as the observation surface, and was observed under a SEM at a magnification of 2000-times. For Sample No. 35, the vertices of neighboring projecting portions were used as a reference line, and the depth of the depression between the projecting portions was measured. The average value of the depths at 10 locations was considered the projecting portion height. Additionally, for Sample Nos. 36 to 39, a line connecting non-bulging portions on the left and right of the protruding portion was used as a reference line and the height was measured. The average value of the heights at 10 locations was considered the projecting portion height. Note that the left/right/front/back spacing between the projecting portions in Sample Nos. 36 to 39 was 50 μm.

Next, the reflectance of the resin layer of each of the samples at a wavelength of 450 nm was measured using a spectrocolorimeter. The results are shown in Table 3.

TABLE 3

| Sample No. | Projecting portion forming method | Regularity of projecting portions | Projecting portion height (μm) | Reflectance (%) |
|---|---|---|---|---|
| 34 | N/A | — | — | 90.0 |
| 35 | Blasting | Not regular | 1.5 | 90.7 |
| 36 | Die pressing | Regular | 1.0 | 91.1 |
| 37 | Die pressing | Regular | 1.5 | 92.1 |
| 38 | Die pressing | Regular | 3.0 | 92.2 |
| 39 | Die pressing | Regular | 5.0 | 92.0 |

As shown in Table 3, it is clear that the reflectance improves due to the plurality of projecting portions 3b with a height of not less than 1.5 μm being included on the surface of the resin layer, and the projecting portions being arranged with regularity.

Working Example 4

Next, samples including metal layers with different surface characteristics were fabricated and subjected to reliability testing.

With the exception of the surface characteristics of the metal layer, the samples were fabricated via the same method as Sample No. 4 in Working Example 1.

Note that after the metal layer was formed, the surface characteristics of the metal layer were machined by blasting, in a manner such that the arithmetic mean roughness Ra of the surfaces of the metal layers were the values shown in Table 4. Then, reliability testing was performed using the same method described in Working Example 1. The results are shown in Table 4.

TABLE 4

| Sample No. | Arithmetic mean roughness Ra (μm) | Time |
|---|---|---|
| 40 | 0.2 | 800 |
| 41 | 0.3 | >1000 |
| 42 | 0.5 | >1000 |
| 43 | 0.8 | >1000 |
| 44 | 1.0 | 900 |

As shown in Table 4, it is clear that endurance time increases due to the arithmetic mean roughness Ra of the surface of the metal layer being not less than 0.3 μm and not greater than 0.8 μm. Moreover, from the results of these Working Examples, it is clear that the light emitting element mounting substrate of the present embodiment has excellent heat radiating properties and high adhesion strength between the resin layer and the metal layer. Accordingly, it is clear that a light emitting device constituted by mounting a light emitting element on the light emitting element mounting substrate will have high reliability.

REFERENCE SIGNS LIST

1 Substrate
2 Metal layer
3 Resin layer
4 Light emitting element
5 Bonding wire
10 Light emitting element mounting substrate
20 Light emitting device

The invention claimed is:

1. A light emitting element mounting substrate, comprising:
   a substrate made from a ceramic;
   a metal layer provided on the substrate, comprising gold or silver as a primary component; and
   a resin layer provided covering at least a portion of the metal layer; wherein
   the resin layer comprises platinum; and
   at least one type of oxide of magnesium, calcium, and copper is present on a surface of the metal layer.

2. The light emitting element mounting substrate according to claim 1, wherein the metal layer comprises:
   silver as a primary component;
   copper at a content of not less than 20 mass % and not greater than 40 mass %; and
   at least one of titanium, zirconium, hafnium, and niobium.

3. The light emitting element mounting substrate according to claim 2, wherein the metal layer comprises:
   at least one of molybdenum, osmium, rhenium, and tungsten.

4. The light emitting element mounting substrate according to claim 2, wherein the metal layer comprises:
   at least one of indium, zinc, and tin.

5. The light emitting element mounting substrate according to claim 1, wherein:
   a total content of magnesium, calcium, and copper in the metal layer is, in terms of oxides, not less than 0.1 mass % and not greater than 5.0 mass %.

6. The light emitting element mounting substrate according to claim 1, wherein:
   the resin layer comprises, on a surface thereof, a plurality of projecting portions with a height of not less than 1.5 μm; and
   the projecting portions are arranged with regularity.

7. The light emitting element mounting substrate according to claim 1, wherein:
   an arithmetic mean roughness Ra of the surface of the metal layer is not less than 0.3 μm and not greater than 0.8 μm.

8. The light emitting element mounting substrate according to claim 1, wherein:
   the resin layer comprises a silicone resin as a primary component; and
   a content of low-molecular-weight siloxane in the silicone resin is not greater than 200 ppm.

9. A light emitting device comprising:
a light emitting element; and
the light emitting element mounting substrate according to claim 1; wherein
the light emitting element is mounted on the light emitting element mounting substrate.

* * * * *